(12) United States Patent
Xu et al.

(10) Patent No.: US 8,367,558 B2
(45) Date of Patent: *Feb. 5, 2013

(54) METHOD FOR TUNING THE WORK FUNCTION OF A METAL GATE OF THE PMOS DEVICE

(75) Inventors: Qiuxia Xu, Beijing (CN); Gaobo Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 102 days.

This patent is subject to a terminal disclaimer.

(21) Appl. No.: 12/990,735

(22) PCT Filed: Jun. 28, 2010

(86) PCT No.: PCT/CN2010/074596
§ 371 (c)(1),
(2), (4) Date: Nov. 2, 2010

(87) PCT Pub. No.: WO2011/063649
PCT Pub. Date: Jun. 3, 2011

(65) Prior Publication Data
US 2011/0256701 A1 Oct. 20, 2011

(30) Foreign Application Priority Data
Nov. 25, 2009 (CN) .......................... 2009 1 0241539

(51) Int. Cl.
*H01L 21/469* (2006.01)

(52) U.S. Cl. ........ 438/778; 438/785; 257/213; 257/288; 257/410; 257/E21.625

(58) Field of Classification Search .................. 438/216, 438/240, 287, 758, 778, 785; 257/213, 288, 257/296, 310, 410, E21.625, E21.639
See application file for complete search history.

(56) References Cited

U.S. PATENT DOCUMENTS

| 2006/0273412 A1* | 12/2006 | Tamura et al. ................ 257/410 |
| 2008/0191286 A1* | 8/2008 | Chang et al. ................. 257/369 |
| 2009/0170344 A1* | 7/2009 | Fukuchi et al. ............... 438/785 |
| 2011/0287620 A1* | 11/2011 | Xu et al. ....................... 438/591 |

FOREIGN PATENT DOCUMENTS

CN 1790640 6/2006

OTHER PUBLICATIONS

"Work Function Tunability by Incorporating Lanthanum and Aluminum into Refractory Metal Nitrides and a Feasible Intergration Process," Wang et al., IEEE 2006, 3 pages. "Thermal Stability of HfTaON Film Prepared by Physical Vapor Deposition" Gaobo et al., Feb. 2009 Chinese Institute of Electronics, 5 pages.

* cited by examiner

*Primary Examiner* — Olik Chaudhuri
*Assistant Examiner* — Su Kim
(74) *Attorney, Agent, or Firm* — Westman, Champlin & Kelly, P.A.

(57) ABSTRACT

A method for tuning the work function of a metal gate of the PMOS device is disclosed. The method comprises depositing a layer of metal nitride or a metal on a layer of high-k gate dielectric by physical vapor deposition (PVD), as a metal gate; doping the metal gate with dopants such as Al, Pt, Ru, Ga, Ir by ion implantation; and driving the doped metal ions to the interface between the high-k gate dielectric and interfacial SiO2 by high-temperature annealing so that the doped metal ions accumulate at the interface or generate dipoles by interfacial reaction, which in turn tunes the work function of the metal gate. The method can be widely used and its process is simple and convenient, has a better ability of tuning the work function of the metal gate, and is compatible with the conventional CMOS process.

10 Claims, 2 Drawing Sheets

METHOD FOR TUNING THE WORK FUNCTION OF A METAL GATE OF THE PMOS DEVICE

CROSS-REFERENCE TO RELATED APPLICATION

This Application is a Section 371 National Stage Application of International Application No. PCT/CN2010/074596, filed Jun. 28, 2010, not yet published, the contents of which are hereby incorporated by reference in their entirety.

BACKGROUND OF THE INVENTION

1. Field of Invention

The present invention relates to semiconductor technology, and in particular, to a method for tuning the work function of a metal gate of the PMOS device, which can be used in manufacture of high performance nanoscale complementary Metal-Oxide-Semiconductor Transistor (CMOS) device at 45 nm and beyond.

2. Description of Prior Art

As a feature size of CMOS device reaches the technology node of 45 nm and beyond, it is well known in the art that the structure of high-k (i. e. dielectric constant)/metal gate materials will be used to replace the conventional structure of $SiO_2$/poly-Si for remarkably decreasing the gate tunneling current and the gate resistance, eliminating the depletion effect in polysilicon and the boron penetration problem in PMOSFET (i. e., P-type Metal-Oxide-Semiconductor Transistor), alleviating Fermi level pinning effect, and improving performance of the device. However, there are still some urgent problems in integrating the metal gate with the high-k gate dielectric, such as poor thermal stability, unfavorable interface states, and especially the Fermi level pinning effect which makes the challenging to provide an appropriate low threshold voltage required by nanoscale CMOS devices, in particular, for PMOS devices, because it is more difficult to achieve the high work function required by PMOS devices.

SUMMARY OF THE INVENTION

It is an object of the present invention to provide a method for tuning the work function of a metal gate of the PMOS device.

To achieve the above object, the inventive method comprises the steps of depositing a layer of metal nitride or a metal on a layer of high-k gate dielectric such as HfLaOH or HfSiON by physical vapor deposition (PVD), as a metal gate; doping the metal gate with dopants such as Al, Pt, Ru, Ga, Ir by ion implantation; driving the doped metal ions to an interface between the high-k gate dielectric and interfacial $SiO_2$ by rapid high-temperature annealing so that the doped metal ions accumulate at the interface or generate dipoles by interfacial reaction which in turn lead to variation of the work function of the metal gate.

The variation of the work function is dependent on the material of the metal gate, the type and profile of the doped ions, and reaction with the interface.

Suitable work function can be obtained by optimizing the energy and dose of ion implantation and heat treatment conditions so as to achieve a suitable threshold voltage. The inventive method can be widely used and its process is simple and convenient, as well as has a better ability to tune the work function of the metal gate, and is compatible with the conventional CMOS process.

According to the present invention, there provides a method for tuning the work function of a metal gate of the PMOS device, comprising, after formation of a device isolation, the steps of 1) cleaning a silicon substrate with the device isolation formed therein;

2) preforming rapid thermal oxidation at about 600-900° C. for about 20-120 seconds, so as to form an interface layer of SiOx or SiON at a surface of the silicon substrate;

3) forming a high-k gate dielectric layer on the interface layer by physical vapor deposition, wherein a Hf—La target and a Hf target are sputtered alternatively in a magnetron reactive sputtering process for deposition of HfLaON, or a Hf target and a Si target are sputtered alternatively in a magnetron reactive sputtering process for deposition of HfSiON, and the high-k gate dielectric layer having different compositions and thicknesses is obtained by adjusting sputtering power or duration for alternative sputtering;

4) performing rapid thermal annealing at about 600-1050° C. for about 10-120 seconds;

5) forming a metal gate on the gate dielectric layer by physical vapor deposition, wherein a metal nitride gate is deposited in a magnetron reactive sputtering process;

6) doping the metal nitride gate by ion implantation of p-type ions;

7) etching to form the metal gate gate stack;

8) performing thermal annealing at about 350-1050° C.;

9) forming back-side ohmic contacts by physical vapor deposition, wherein an Al—Si layer is deposited on the back side by a direct current sputtering process;

10) alloying the resulting structure by annealing in an alloying oven in $N_2$ gas or forming gas at about 380-450° C. for about 30-60 minutes.

The inventive method tunes the work function of a metal gate by doping the metal gate with metal ions and performing rapid thermal annealing so that the doped metal ions accumulate at the interface between the high-k gate dielectric and interfacial $SiO_2$ or generate dipoles by interfacial reaction, and achieves a suitable low threshold voltage. The inventive method can be implemented in a simple and convenient process, has good thermal stability and has a better ability of tuning the work function of the metal gate. Also, the inventive method is compatible with the CMOS process, and can be applied to integrated circuit industry.

DETAILED DESCRIPTION OF EMBODIMENTS

Figure 3:
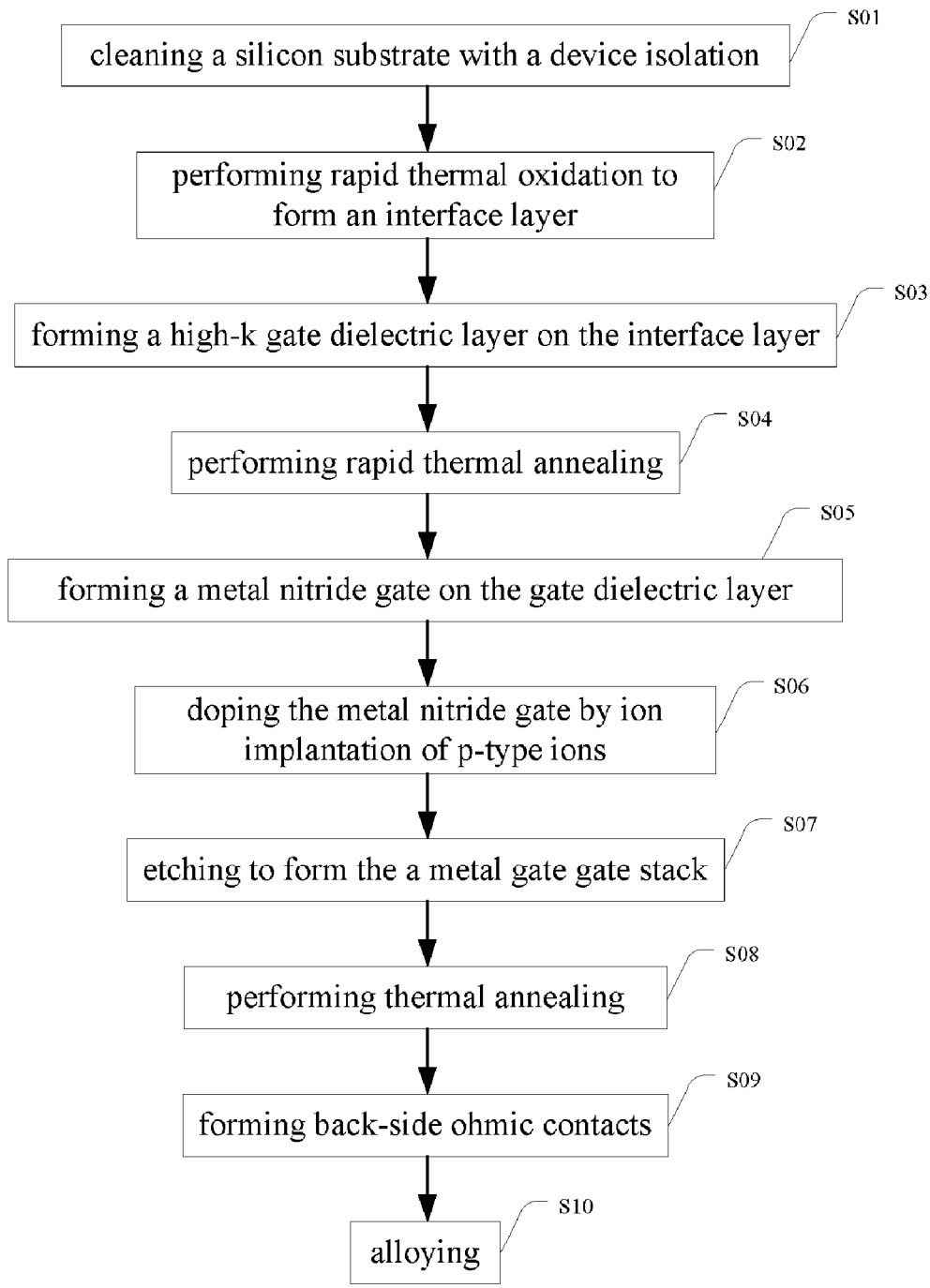
FIG. 3 is a flow chart illustrating a method for tuning the work function of a metal gate of a PMOS device according to an embodiment of the present disclosure.

Step 1: after formation of a device isolation and before formation of an interface oxide layer, cleaning a silicon substrate with device isolation having being formed therein, by firstly washing it with a conventional process, and then immersing it into a mixed solution (hydrofluoric acid:isopropanol:water=0.3-0.8%:0.01-0.08%:1%, by volume) at room temperature for 2-10 minutes, and then rinsing it with deionized water, and then drying it in $N_2$ gas, and then immediately growing interface layer of SiOx (step S01 in FIG. 3);

Step 2: forming an interface layer of SiOx having a thickness of about 5-7 Å, by using rapid thermal annealing (RTA) in $N_2$ gas for about 20-120 seconds (step S02 in FIG. 3);

Step 3: forming a high-k gate dielectric layer of HfLaON having a thickness of about 10-40 Å by physical vapor deposition, wherein a Hf—La target and a Hf target are sputtered alternatively in $N_2$/Ar mixed gas in a magnetron reactive sputtering process, under an working pressure of about $5\times10^{-3}$ Torr and with a sputtering power of about 100-500 W (step S03 in FIG. 3);

Step 4: performing ultrasonic cleaning firstly in acetone for about 5-10 minutes and then in ethanol for about 5-10 minutes, and rinsing it with deionized water, and then drying it in $N_2$ gas;

Step 5: after deposition of the high-k dielectric layer and immediately after the wafer is dried, performing rapid thermal annealing in a oven at about 600-1000° C. for about 10-120 seconds (step S04 in FIG. 3);

Step 6: forming a metal nitride gate of TiN having a thickness of about 5-100 nanometers by magnetron reactive sputtering, wherein a Ti target is sputtered in $N_2$/Ar mixed gas, under an working pressure of about $5\times10^{-3}$ Torr and with a flow rate of $N_2$ of about 2-8 sccm and a sputtering power of about 600-1000 W (step S05 in FIG. 3);

Step 7: performing ion implantation of Ga, with an implantation energy of about 5 Kev-80 Kev and an implantation dose of about $1\times10^{14}$-$6\times10^{15}$/cm$^2$ (step S06 in FIG. 3);

Step 8: etching the TiGaN gate by Cl-based reactive plasma etching, with an RF power of about 100-400 W (step S07 in FIG. 3);

Step 9: performing rapid thermal annealing in a oven at about 700-1050° C. for about 2-30 seconds in protective $N_2$ gas for a gate-first process, and at about 400-500° C. for about 20-60 minutes in protective $N_2$ gas for a gate-last process (step S08 in FIG. 3);

Step 10: forming back-side ohmic contacts by physical vapor deposition, wherein an Al—Si layer having a thickness of about 60-100 nanometers is deposited on a back side by a direct current sputtering process in an Ar gas (step S09 in FIG. 3);

Step 11: alloying the resulting structure at about 380-450° C. in protective $N_2$ gas or forming gas for about 30-60 minutes (step S10 in FIG. 3).

Figure 1:
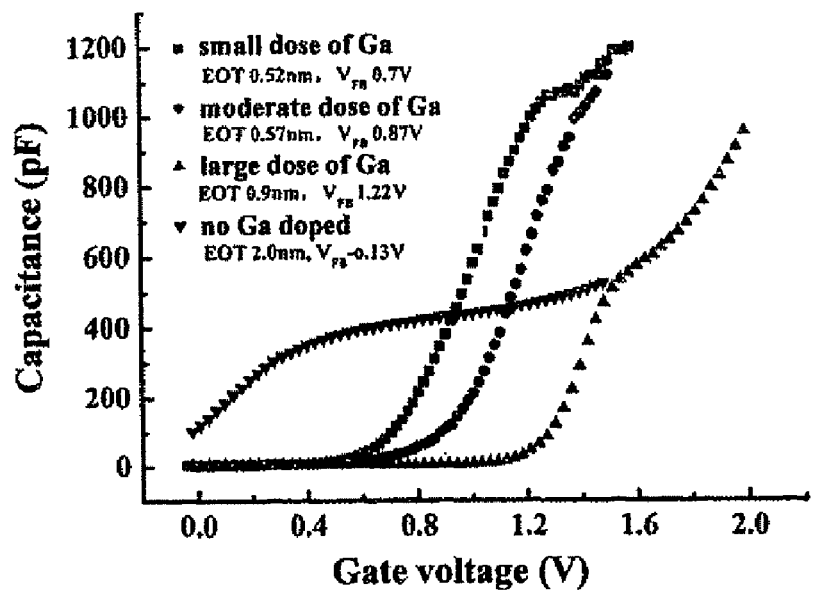
FIG. 1 shows high-frequency C-V characteristics of the PMOS capacitors with the gate stack of TiGaN/HfLaON/IL $SiO_2$/N (100) Si, in which the metal gate TiGaN has different Ga contents due to different Ga implantation dose.

As shown in FIG. 1, when an implantation dose of Ga increases, the C-V characteristic curve shifts dramatically in a positive direction, which means that a flat-band voltage also shifts dramatically in a positive direction. That is, the work function of the PMOS device increases dramatically. For a moderate implantation dose of Ga, the flat-band voltage shifts by about 1V in a positive direction, which is a remarkable value compared with undoped TiN. Moreover, EOT decreases because Ga diffuses to an interface between the high-k gate dielectric and interfacial $SiO_2$ and reacts with oxygen and nitrogen contained therein, which further increases the dielectric constant (the K value) of the gate dielectric.

Figure 2:
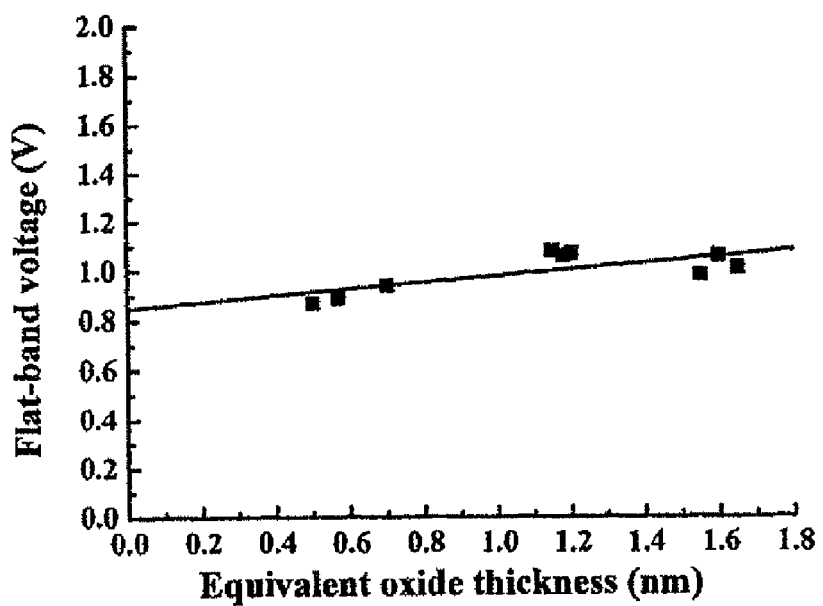
FIG. 2 shows a flat-band voltage (VFB) vs. an equivalent oxide thickness (EOT) of gate dielectric of the PMOS capacitors with the gate stack of TiGaN/HfLaON/IL $SiO_2$/N (100) Si.

As shown in FIG. 2, it can be derived that the effective work function of the PMOS device is about 5.17V from EOT=0 and $V_{FB}$=0.86V, which reaches at the top of valence-band. The effective work function can meet the requirement for the fabrication of the PMOS device having a metal gate.

What is claimed is:

1. A method for tuning the work function of a metal gate of a PMOS device, comprising, after formation of a device isolation, the steps of
   1) cleaning a silicon substrate with the device isolation formed therein;
   2) performing rapid thermal oxidation at about 600-900° C. for about 20-120 seconds, so as to form an interface layer of SiOx or SiON at the surface of the silicon substrate;
   3) forming a high-k gate dielectric layer on the interface layer by physical vapor deposition, wherein a Hf—La target and a Hf target are sputtered alternatively in a magnetron reactive sputtering process for deposition of HfLaON, or a Hf target and a Si target are sputtered alternatively in a magnetron reactive sputtering process for deposition of HfSiON, and the high-k gate dielectric layer having different compositions and thicknesses is obtained by adjusting sputtering power or duration for alternative sputtering;
   4) performing rapid thermal annealing at about 600-1050° C. for about 10-120 seconds;
   5) forming a metal nitride gate on the gate dielectric layer by physical vapor deposition, wherein the metal nitride gate is deposited in a magnetron reactive sputtering process;
   6) doping the metal nitride gate by ion implantation of p-type ions;
   7) etching to form a metal gate stack;
   8) performing thermal annealing at about 350-1050° C.;
   9) forming back-side ohmic contacts by physical vapor deposition, wherein an Al—Si layer is deposited on the back side by a direct current sputtering process;
   10) alloying the resulting structure by annealing in an alloying oven in N2 gas or forming gas at about 380-450° C. for about 30-60 minutes;
   wherein the p-type ions are driven to an interface between the high-k gate dielectric and interfacial $SiO_2$ by the rapid thermal annealing so that the p-type ions accumulate at the interface or generate dipoles by interfacial reaction.

2. The method according to claim 1, wherein the step 1) comprises immersing the silicon substrate in a mixed solution of hydrofluoric acid:isopropanol:water=0.3-0.8%:0.01-0.08%:1% by volume for about 2-10 minutes.

3. The method according to claim 1, wherein in the step 2), the interface layer of SiON is formed by firstly implanting nitrogen and then performing rapid thermal oxidation, or by firstly performing oxidation and then performing plasma nitridation.

4. The method according to claim 1, wherein in the step 3), the high-k gate dielectric layer is deposited in N2/Ar mixed gas, by sputtering the Hf—La target and the Hf target alternatively, or the Hf target and the Si target alternatively, in such a manner that the high-k gate dielectric layer thus formed has different compositions and thicknesses by adjusting sputtering power or duration for alternative sputtering.

5. The method according to claim 1, wherein in the step 5), the metal nitride gate is formed by sputtering one of a Ti target, a Ta target and a Mo target in N2/Ar mixed gas for the formation of the corresponding one of TiN, TaN and MoN.

6. The method according to claim 1, wherein in the step 6), the doped ion for the PMOS device is one of the p type metal ions, such as Al, Pt, Ru, Ga or Ir.

7. The method according to claim 1, wherein in the step 7), the metal nitride gate of TiN or TaN gate sack is formed by Cl-based reactive ion etching or by wet chemical etching.

8. The method according to claim 1, wherein in the step 8), performing one of rapid thermal annealing, spike annealing, and laser annealing at about 950-1200° C. for about 5 milliseconds –30 seconds for a gate-first process.

9. The method according to claim 1, wherein in the step 8), performing thermal annealing in a oven at about 350-550° C. for about 20-60 minutes for a gate-last process.

10. The method according to claim 1, wherein in the step 9), the Al—Si layer deposited at the back side has a thickness of about 80-120 nanometers.

* * * * *